United States Patent [19]

Rockwell

[11] 4,224,690
[45] Sep. 23, 1980

[54] HIGH SPEED PARALLEL SCANNING MEANS FOR TESTING OR MONITORING THE ASSEMBLY OF MULTIWIRE HARNESSES

[75] Inventor: Kenneth N. Rockwell, Yorba Linda, Calif.

[73] Assignee: Thomas & Betts Corporation, Raritan, N.J.

[21] Appl. No.: 968,828

[22] Filed: Dec. 12, 1978

[51] Int. Cl.³ .................... G01R 31/02; G06F 11/00
[52] U.S. Cl. ........................ 371/25; 324/51; 324/73 R; 364/580; 371/20
[58] Field of Search ............. 235/302; 324/73 AT, 324/73 R, 51, 52, 54, 66; 364/579, 580, 488, 489

[56] References Cited

U.S. PATENT DOCUMENTS

| | | | |
|---|---|---|---|
| 3,714,571 | 1/1973 | Walker | 235/302 |
| 3,986,106 | 10/1976 | Shuck et al. | 324/51 |
| 4,015,200 | 3/1977 | Strandh | 324/51 |
| 4,097,797 | 6/1978 | Finet | 235/302 |
| 4,110,807 | 8/1978 | Neuhouser | 324/51 |
| 4,110,880 | 9/1978 | Peppler et al. | 324/51 |
| 4,114,093 | 9/1978 | Long | 324/51 |

*Primary Examiner*—Charles E. Atkinson
*Attorney, Agent, or Firm*—James J. Daley; Robert M. Rodrick

[57] ABSTRACT

High speed solid state apparatus is described for learning, testing and monitoring the assembly of multiconductor harnesses. Testing a harness having a very large number of end points within the matter of a few seconds is made possible through the employment of plural high speed scanning means which operate independently of one another and simultaneously scan groups of points to identify both continuity and open circuit conditions.

During a learning mode, all short circuit and open circuit conditions of a known good harness are transferred into high speed memory means.

Said plurality of scanning means examine all points relative to a preselected point during a scan cycle, repeating scan cycles for every point to be tested.

Data representative of the detected interconnections are transferred to memory when all of said plural scanning means have completed the scan for said preselected point. The system provides for: learning the connections of a known good harness and storing data representative of the connections in high speed memory; high speed testing of completed harnesses by examination of the harness at high speed to ascertain the interconnections and comparing interconnections against the data stored in memory; and monitoring the assembly of a cable to provide direct indications of an incorrect connection, as well as having a capability of permanently latching a momentary fault condition for purposes of localizing the spurious condition.

27 Claims, 4 Drawing Figures (SHEET 1)

(SHEET 2)

(SHEET 1)

(SHEET 2)

HIGH SPEED PARALLEL SCANNING MEANS FOR TESTING OR MONITORING THE ASSEMBLY OF MULTIWIRE HARNESSES

BACKGROUND OF THE INVENTION

Multiconductor cable harnesses are utilized in a wide variety of applications and are especially advantageous for use in connecting the contacts of remotely located electrical components and/or circuits wherein it is further desired to establish solderless contact engagement of the selectively releasable type which is extremely advantageous for use in apparatus of modularized design to facilitate removal and replacement of the components without the need for soldering and resoldering connections, the latter activities being both tedious and time consuming.

The assembly and testing of multiconductor wire harnesses are, likewise, tedious and time consuming manual activities. As a result, efforts have been made to simplify such procedures. Making reference to U.S. application Ser. No. 968,820, filed Dec. 11, 1978, in the names of William Helms and Jack Adams and assigned to the assignee of the present invention, a review of efforts to facilitate testing and assembly of multiconductor harnesses is set forth. Summarizing these efforts, apparatus has been developed for identifying and displaying the number of a wire in a multiconductor harness selected by an operator to facilitate harness assembly. In the testing field, completed harnesses have been compared in test rigs against known good harnesses by coupling the end connectors of the known good harness in parallel with the harness under test and detecting for the presence of completed circuit loops to establish the correctness of the interconnections for the harness under test. Efforts have also been directed to providing a memory means containing information representative of the known good harness and for comparing the harness under test against the stored data, although these later efforts have been less than successful.

It was not until the advent of the invention described in copending application Ser. No. 968,820 that apparatus became available for testing harnesses at high speed by examining the electrical interconnections of a harness under test, said apparatus incorporating novel scanning and encoding means and means for comparing the data obtained representative of the electrical interconnections with data of a known good harness stored in a high speed random access memory, as well as means for providing visual and/or audible displays to indicate good harnesses and, in the case of defective harnesses, to indicate erroneous connections, the nature of the erroneous connection, and the identity of the erroneous connection points.

Using the above-identified system described in copending application Ser. No. 968,820, which may be characterized as employing a serial scanning technique, tests for continuity between a preselected point and all remaining points of a harness, on a one-at-a-time basis requires several seconds to complete. Efforts to shorten the scanning interval for the above technique have been unsuccessful due to the presence of capacitance between conductors of a harness. The higher the capacitance values, the larger the test current required to provide a current flow for a time interval sufficient to be assured that a conductive path is present.

A scan time of several seconds is unacceptable for advising an assembler of the nature of the last assembled conductor. An upper limit of under two seconds is deemed to be satisfactory for advising an assembler of the verification of correctly connected conductor, or, alternatively, the presence of an incorrectly connected conductor.

BRIEF DESCRIPTION OF THE INVENTION

The present invention is characterized by comprising a system for learning, testing and assisting in the assembly of multiconductor harnesses employing a parallel scanning technique capable of simultaneously testing for continuity between one point and several other groups of points. The system is designed to significantly reduce total test time while, at the same time, keeping system costs low.

The system incorporates a microprocessor based design in which the microprocessor controls the operation of a plurality of test modules, each module including interconnected send and receive-type scanners and continuity detection means. The scanners of each module are operated simultaneously under control of the microprocessor and are designed to independently terminate a scan either upon the detection of a continuity condition or when all points of a module have been scanned. Means are employed to detect the fact that all modules have recognized either a continuity condition or a terminal count to signify a temporary halt in the operation of scanners in all modules. This indication initiates a routine which causes all modules to be polled wherein each of the points for which a continuity condition exists are verified against information stored in high speed memory means in the order of the module having the lowest numbered point being polled first. Each continuity condition is successively tested in this fashion. If each continuity condition proves to be correct, the point of the continuity condition identified by the next highest module is tested in a similar fashion. In the event that any continuity point fails comparison, an immediate indication is provided that either an erroneous open or short circuit condition is present.

In the event that a test shows that a continuity condition is present for a lower point than that stored in memory, this serves as an indication of the presence of an erroneous short condition and this information is displayed. If a test shows that a continuity condition is present on a higher point than the one stored in memory, this is an indication of an open circuit condition, and this information is also displayed.

Data for testing harnesses may be entered into system memory by way of a learn mode during which a known good harness is connected to the points to be scanned and is tested in a similar fashion in order to convert the detected interconnections into data representative of the nature of the interconnections and identifying the points associated with said interconnections.

The system provides for another technique for learning a known good harness which is accomplished by loading the data representing the harness interconnections into memory from an external tape cassette containing the data system in frequency shift keyed (FSK) form. Novel demodulator means is provided for demodulating data received in the FSK format, extracting a synchronizing signal from the data, and transferring the data into the system for storage in the system high speed random access memory.

FSK data in the tape cassette may be derived from system memory through FSK modulation means provided in the system to convert data from the system memory and arranged in a binary non-return-to-zero (NRZ) format to the FSK format for recording on standard audio tape. Inexpensive recorders may be used for recording data from system memory or transferring data from tape cassette to system memory without affecting the integrity of the data, due to the techniques employed and the design of the modulation and demodulation equipment utilized by the system of the present invention.

The system of the present invention may also be employed for purposes of monitoring the assembly of harnesses to advise the assembler that the proper conductors are being coupled to the proper connection points. Monitoring is accomplished by coupling the connection points of the system to connectors provided along a work surface and assembling the wires to the connection points of the harness and connectors. The system operates as a monitor means for monitoring each connection, wherein open circuit conditions are ignored during the performance of a monitor mode. Scanning of all points is performed in the same manner as described above with respect to a learn mode. Upon the occurrence of an incorrect connection, an immediate audible alarm is provided. Means are also provided for displaying the identifying numbers of the end points of the erroneous connection. A routine is provided for continuously repeating a full scan to search for the recurrence of momentary fault conditions in order to provide a means for localizing the occurrence of such momentary faults.

OBJECTS OF THE INVENTION

It is, therefore, one object of the present invention to provide a novel system for learning harnesses by testing data representing the interconnections of the harness, wherein parallel testing operations are performed to identify said interconnections, thereby considerably reducing the learning period.

Still another object of the present invention is to provide a novel system for testing completed harnesses against a known good harness wherein: data representing the interconnections of the known good harness are stored in high speed memory means, the interconnections of the harness under test are ascertained by a scanning technique and are compared against the data stored in memory, and wherein display means are provided to indicate the successful completion of a test or, alternatively, the nature and identity of erroneous interconnections, said testing operations comprising a plurality of scanning means operating simultaneously to significantly reduce testing time.

Still another object of the present invention is to provide a novel system for monitoring the assembly of multiconductor harnesses and the like, wherein: data representing the interconnections of a known good harness are stored in a high speed memory, a plurality of scans of the harness end points are performed simultaneously and independently of the order of assembly steps to ascertain the nature and identity of completed interconnections, wherein the completed interconnections are compared against the data stored in memory and wherein display means are provided to indicate successful assembly of a harness or, alternatively, wherein alarm means is activated to indicate an incorrect connection and, in connection therewith, said display means provides a display of the incorrect interconnection by identifying the end points of the erroneous interconnection and the nature of the erroneous interconnection.

Still a further object of the present invention is to provide a novel system of the type described hereinabove and wherein scanning may be automatically repeated to search for the recurrence of spurious momentary interconnections.

Still another object of the present invention is to provide novel FSK demodulation means employing binary solid state circuits requiring no adjustment or tuning.

The above as well as other objects of the present invention will become apparent when reading the accompanying description in conjunction with the following drawings:

DETAILED DESCRIPTION OF THE INVENTION

The system of the present invention is similar in many respects to that described in application Ser. No. 968,820 referred to hereinabove and, as a result, the aforesaid application is incorporated herein by reference thereto for purposes of simplifying and reducing the detailed description of the present invention.

Figure 1:
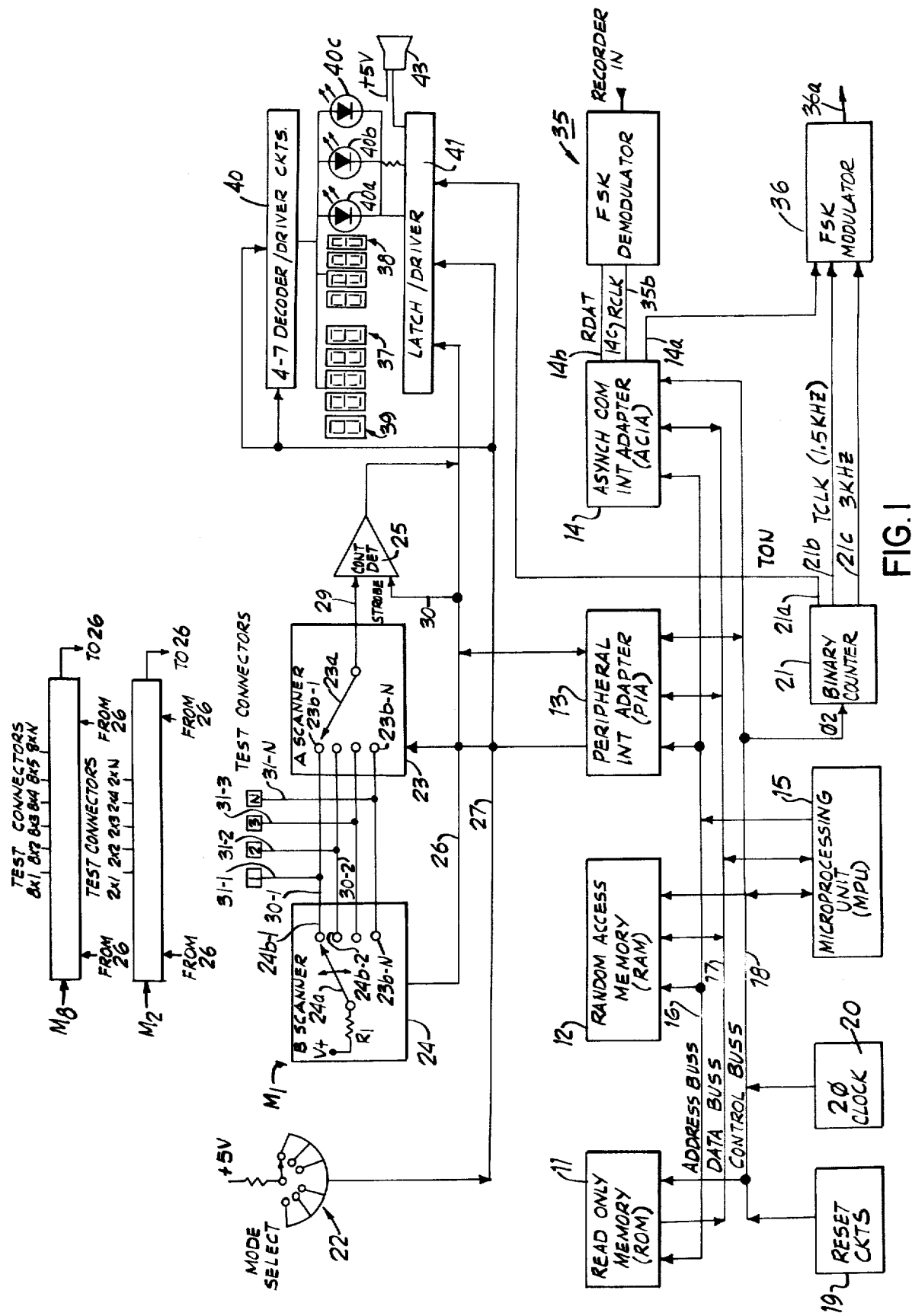
FIG. 1 shows a simplified block diagram of a system for learning and testing completed multiconductor harnesses, as well as being capable of monitoring the assembly of harnesses in accordance with a known standard.

FIG. 1 shows a simplified block diagram of the system 10 designed in accordance with the principles of the present invention and is comprised of a microprocessing unit (MPU) 15 which controls the operation and the order of operation of all the system subassemblies. Microprocessor unit (MPU) 15 operates in accordance with program routines stored in read only memory (ROM) 11 which is interfaced with MPU 15 through data buss 17 and address buss 16. Program steps are extracted (in a non-destructive readout manner) from ROM 11 under control of MPU 15 by means of address buss 16 and data buss 17.

The means for mode selection is shown in simplified schematic fashion as being constituted of a rotary type settable switch 22 adapted to be set to any desired position for indicating to MPU 15 the selected mode. The state of the mode select switch 22 is conveyed to MPU 15 through parallel data buss 27 and the peripheral interface adapter (PIA) 13.

As shown in aforementioned application Ser. No. 968,820 and, more particularly, in FIG. 2 thereof, the system is provided with connector sockets for releasable engagement with compatible connector plugs for directly connecting the output points arranged along the rear panel of the system to the harness (not shown) under test or, alternatively, to the harness being assembled upon a work surface (not shown).

The test signals generated by the system are applied to the points of the aforementioned connectors by means of a B scanner 24 which is operated under control of MPU 15 through the peripheral interface adapter (PIA) 13, coupled thereto by way of data busses 26 and 27. As will be made obvious from a detailed description set forth hereinbelow, as well as by making reference to the aforementioned copending application Ser. No. 968,820, B scanner 24 and A scanner 23 are electronic solid state devices of the integrated circuit type. More particularly, the scanners which are employed to provide sequential access to the points to be learned or tested are actually configured of a plurality of analog switch devices each having a common input and eight output terminals as shown in FIG. 4d of the aforementioned copending application Ser. No. 968,820. Binary type control signals are utilized for switching and selection purposes as is described in detail in the aforementioned copending application Ser. No. 968,820.

For purposes of simplicity in understanding the simplified block diagram of the present application, the A scanner 23 is shown as a mechanical rotary type stepping switch. Switch arm 23a is coupled through common output line 29 to one input of a continuity detector 25 to be more fully described hereinbelow, to sequentially connect the continuity detector to each of the stationary contacts 23b-1 through 23b-N, each of which is connectable with the rotary switch arm 23a as it is incrementally stepped through a cycle. Control of the A scanner 23 is provided by MPU 15 in accordance with the program steps in the read only memory (ROM) 11, control signals being coupled to A scanner 23 through peripheral interface adapter (PIA) 13. In the example given, the A scanner, in one preferred embodiment, is provided with 128 contact points 23b.

The A scanner is operated in a predetermined manner with a B scanner 24, the detailed operation being described hereinbelow. B scanner 24 is preferably comprised of substantially the same solid state integrated circuit elements as A scanner but, for purposes of simplicity, has been diagramatically represented as consisting of rotary switch arm 24a coupled through a common terminal to d.c. voltage source V+. Switch arm 24a is adapted to be incrementally stepped from each of the stationary contacts 24b-1 through 24b-N, which stationary contacts are numbered in an identical manner to the stationary contacts 23b of A scanner 23. The switch arm 24a is designed to establish an electrical connection between the stationary contact 24b to which it is connected and d.c. voltage source V+. The switch arm of the A scanner 23 is adapted to engage each stationary contact 23b to enable continuity detector 25, whose remaining input receives a strobe pulse through line 30, to perform a continuity test only upon the occurrence of a strobe pulse to thus be assured that switching of the A and B scanner switch arms has been completed and thereby prevent the performance of a continuity detection test when the switch arms 23a and/or 24a are either just moving upon a stationary contact, just moving off of a stationary contact, or are located between two contacts.

As can further be seen, like numbered points of the B scanner stationary contacts 24b are directly electrically connected through conductive leads 30 to like numbered points of A scanner 23 as shown. For example, stationary contact 24b-1 is connected to stationary contact 23b-1 by conductive lead 30-1; contacts 24b-2 and 23b-2 are connected to one another by conductive lead 30-2, and so forth. In the example shown, it should be understood that each scanner may be provided with a greater or lesser number of stationary contacts and, in some embodiments, up to 200 points have been provided for connection with each scanner. Considering FIG. 2 of the aforementioned copending application Ser. No. 968,820, in the case of a 200 point scanner, the points are interconnected in the manner shown through the provision of 200 lines comprised of the branch connecting lines 31-1 through 31-N. Each of these lines is connected to a like numbered point in one of the connector sockets 31-34 provided along the rear panel of the system housing shown in FIG. 2 of the aforementioned copending application.

Continuity detector 25 is preferably a comparator amplifier and operates to develop an output signal when a signal is presented to the input coupled to lead 29 (which signal is derived from voltage source V+ of the B scanner 24) and when a strobe pulse is applied through line 30 to the remaining input of continuity detector 25, simultaneously in occurrence with the voltage level V+. The output signal developed by continuity detector 25 is coupled to logical gating circuitry (to be more fully described) which temporarily halts the scan of A scanner 23 and advises the MPU 15 of this temporary halt. The continuity detector is coupled to MPU 15 through the PIA 13 in order to advise the MPU 15 of a continuity condition. The MPU 15 causes this condition to be stored in RAM 12 during a LEARN mode or causes the detected condition to be compared against the data of a known good harness previously stored in RAM 12 during a TEST mode.

In the preferred embodiment, the A and B scanners 23 and 24 are each preferably arranged upon a common printed circuit board which includes the integrated circuit chips (i.e., the analog switch devices) making up the A and B scanners, sufficient for scanning 128 points.

The system 10, in the preferred embodiment, is provided with a total of eight modules M1-M8, each module containing an A scanner (23), a B scanner (24), a continuity detector (25), the electrical interconnections between stationary contacts (30), the branch connections (31) coupling the A and B scanners and the logic and control circuitry (to be more fully described) for interconnecting the A and B scanners and the MPU 15. For purposes of simplicity, module M1 has been shown in detail (and has been described in detail hereinabove), and modules M2 and M8 have been shown in block diagram form, modules M3-M7 having been omitted for purposes of simplicity, it being understood that these modules are likewise identical in both design and function to those shown in FIG. 1.

As was mentioned hereinabove, the system 10 has the capability of learning from a known good harness in order to load the RAM 12 with data representative of the type of interconnection, (i.e., open or short), and interconnecting points of the known good harness (as will be described in detail hereinbelow). In addition thereto, RAM 12 may also be loaded from an external source in the form of a tape cassette. The tape cassette (not shown) is placed in an inexpensive recorder whose output jack is adapted to be coupled to a frequency shift keyed (FSK) demodulator 35 incorporated in system 10. The demodulator FSK 35, as will be described in detail hereinbelow, demodulates the FSK signal train to convert the signal train into a train of non-return-to-zero (NRZ) binary bits of data which are applied through R DAT output line to input 14b of an asynchronous communications interface adapter (ACIA) 14. Demodulator 35 also recovers a synchronizing signal from the FSK signal train and applies the synchronizing signal through the received clock R CLK line to a second input 14c of the ACIA 14. The ACIA 14 receives the data in an eleven bit data format as shown in detail in FIG. 5 of the aforementioned copending application Ser. No. 968,820. Each transmitted word is comprised of a start bit (which is always binary "0"), eight data word bits with the least significant bit being transmitted first, an even parity bit, and a stop bit (which is always binary "1"). As the data bits are being received by ACIA 14, the ACIA 14 internally generates a parity bit. Once the entire data word has been received, the internally generated parity bit is compared against the transmitted parity bit to be assured of the accuracy of the received word. The ACIA 14 further comprises a register into which the data bits, applied to the ACIA 14 in serial fashion, are loaded. When the word is fully loaded into the register and passes the parity check, the data word is then shifted in parallel fashion out of ACIA 14 and through data buss 17 to RAM 12, whereby the microprocessing unit (MPU) 15 directs the received data word, under control of the Read In subroutine stored in ROM 11, to the proper address in RAM 12.

The ACIA 14 also functions as the communications interface for transmitting data from RAM 12 through a modulator 36 in order to transfer the data (in a nondestructive readout manner) to a tape cassette recorder (not shown) for ultimate use in a remotely located system similar to system 10 by reading in the FSK data stored in the tape cassette into the remotely located system in the same manner as was described briefly hereinabove.

In the Recorder Out mode, i.e., in the mode where a tape cassette is prepared based upon the data stored in RAM 12, the cassette recorder is loaded with a tape cassette and is turned on. The ACIA 14 operates under control of MPU 15 which sequentially applies data words to the ACIA 14, wherein the 8 bits making up a data word are loaded into ACIA 14 in parallel. Each word is the shifted out in serial fashion, and a start bit, a parity bit and a stop bit are added thereto. The start bit, the eight data bits, the parity bit and the stop bit are sequentially applied through a transmit data (T DAT) line 14a to a frequency shift keyed (FSK) modulator 36 which receives a 1.5 kHz signal on line T CLK from output 21b of binary counter 21 and which receives a 3 kHz signal from the 3 kHz output line 21c of binary counter 21. In accordance with the binary level of nonreturn to zero (NRZ) data applied to the T DAT line, the FSK modulator 36 selects the appropriate frequency signal which is transferred to the recorder output line 36a.

The system display arrangement is comprised of two sets 37 and 38 of segmented numeric LED's, set 37 being provided to identify the lower number contact position and set 38 being adapted to identify the higher number contact position. The left-handmost numeric LED 39 is adapted to identify the nature of the condition and in actuality is adapted to present an illuminated "P" to indicate a pass condition, i.e., that a tested harness has been indicated as being correct; an illuminated "0" to indicate an open circuit condition (when in TEST or MONITOR modes); an illuminated "S" to indicate a short circuit condition (when in SELF-TEST, TEST or MONITOR modes); and an illuminated "E" to indicate an error condition (when in any of the above operating modes).

A series of discrete LED's 40a–40l are provided to identify the module M in which an error condition has occurred. Although there are a plurality of discrete LED's, the majority of these discrete LED's have been omitted from FIG. 1 for purposes of simplicity.

The LED's of both the discrete and numeric are controlled by 4–7 Decoder/Driver circuits 40 in cooperation with Latch/Driver circuits 41, which circuits are under control of signals derived from PIA 13 which, in turn, is controlled by MPU 15. The LED's are operated in a time division multiplexed fashion wherein the Latch/Driver 41 scans each of the digits in a cyclic fashion providing drives to their cathode elements. In synchronization with this operation, the Decoder/Driver circuits provide drive to the selected anodes of the LED devices. The circuits 40 are provided with BCD to seven segment decoder devices which convert information in BCD format into seven segment drive signals which appear in various combinations corresponding to the number ("0"–"9") to be illuminated. Latch/Driver circuitry 41 is also utilized to operate the internal speaker 43 to provide an audible alarm which operates in the MONITOR mode in the event of detection of an error during the assembly of a harness.

A brief description of the various modes will now be set forth:

The mode select switch 22 is operated to select the desired mode and also serves to vector MPU 15 to the first program step. A detailed description of this capability is set forth in the aforementioned copending application Ser. No. 968,820.

Assuming that a Learn mode is selected, a known good harness has its end connectors coupled into the connecting sockets of the system or coupled into interfacing connectors which serve as electrical interfaces between the connectors of the system 10 and the end connectors of the multiconductor harness.

The first point (24b-1) of the B scanner of module M1 selected, i.e., the switch arm 24a of module M1 engages contact 24b-1. Switch arm 23a of the A scanner moves to engage contact 23b-2. With switch arm 24a engaging contact 24b-1, the MPU 15, under control of the Learn subroutine in ROM 11, causes switch arm 23a of A scanner 23 to scan through points 23b-2 through 23b-N. As switch arm 23a engages each of the aforesaid cooperating stationary contacts, a strobe pulse is developed on line 30 to enable continuity detector 25. In the event that a test connection is established (through the harness being "learned") between point 1 (connected to B scanner point 24b-1) and any of the points 23b being scanned by A scanner 23, continuity detector 25 will develop a continuity signal at its output, which signal, as will be more fully described hereinbelow, initiates a temporary halt in the scanning operation of the A scanner 23 in module M1.

It should be noted that A scanners of all scanning modules M2–M8 are also operated to scan simultaneously with the A scanner of module M1. The continuity detectors in each of these modules M2–M8 are operated during each stepping operation to the next stationary contact, upon the application of a strobe pulse as was mentioned hereinabove. Each of the modules M2–M8 also experience a temporary halt in the scanning cycle, upon detecting a continuity condition with point 24b-1 (through the harness).

In the event that any one module fails to detect a continuity condition, the A scanner will continue to advance its switch arm 23a until the switch arm reaches the last or highest numbered point of the stationary contact group forming part of the A scanner. The occurrence of a complete scan, hereinafter referred to as a Terminal Count, also brings a temporary halt to the scanning operation of the A scanner for the associated module.

Logical gating means, to be more fully described hereinbelow, are provided on each module M1-M8, which logical gating means of each module are interconnected with the gating means of the next higher and next lower order module (M+1 and M−1) to cause a signal to be developed with all modules M1-M8 reach a condition of either detection of a state of continuity or a Terminal Count. When this condition occurs in all modules M1-M8, a signal is let out from said logical gating means through PIA 13 to MPU 15 to indicate that all modules M1-M8 have either detected a continuity condition or arrived at a Terminal Count. The MPU 15, in accordance with the program subroutine of ROM 11, then polls each of the modules M1-M8 in sequence, the lowest order module (M1) selected first, followed by module M2, and so forth. When polling each module, in the event that a Terminal Count has been detected at that module, the module is skipped over to the next succeeding module until the module presently being polled indicates a continuity condition. In the event that a continuity condition is discovered on the modules being polled, this condition is stored in RAM 12 by inserting the address of the A scanner point 23$b$ at which continuity has been detected, into the memory location whose address corresponds to the point 24$b$ of B scanner 24.

In the event that all modules M1-M8 indicate a Terminal Count, the address corresponding to point 23$b$-1 of A scanner 23 of module M1 is written into the memory location whose address represents 24$b$-1, so that the address location (in binary form) and content of that memory location (in binary form) are identical, which scheme is utilized to indicate an open circuit condition.

Upon completion of a poll of all modules M1-M8 by MPU 15, each scan is reinitiated for those modules whose A scanner switch arm 23$a$ has not arrived at a Terminal Count. In the event that further continuity conditions are detected on those modules which have not reached a Terminal Count, a subsequent continuity detecting signal will be developed, causing a further temporary halt in scanning. These points will be polled and transferred to RAM 12 in the same manner as was previously described through the polling technique carried out under control of MPU 15, and each scan for those modules M which have not reached a Terminal Count will be continued until continuity points have been identified and all modules have reached a Terminal Count, at which time the MPU 15 causes the B scanner switch arm 24$a$ of the module M1 to advance to engage stationary contact 24$b$-3, switch arm 23$a$ of A scanner 23 of module M1 is advanced to stationary contact 23$b$-3, and switch arm 24$a$ of B scanner 24 of module M1 is stepped backwardly to stationary contact 24$b$-2 whereupon the scan operation is reinitiated. It should also be understood that the switch arms 23$a$ of the A scanners 23 for the modules M2-M8 are all stepped to their stationary contacts 23$b$-3, and the B scanner switch arms 24$a$ of all modules M2-M8 are isolated from all of their associated stationary contacts. The scanning routine for all modules M1-M8 is then repeated, during which each contact point sequentially engaged by the switch arms 23$a$ of the A scanners of modules M1-M8 are tested for possible continuity with point 24$b$-2.

Thus, the A scanners are operated to enable their associated continuity detectors to detect for continuities until all A scanners are ultimately stepped to a Terminal Count which condition indicates that the next scan may be initiated. In accordance therewith, the B scanner switch arm 24$a$ in module M1 is stepped to contact 24$b$-4, the A scanner switch arm 23$a$ in module M1 is stepped to 23$b$-4, and the B scanner switch arm 24$a$ is then stepped backwardly to contact 24$b$-3, whereupon the A scanner 23 (for module M1) is stepped through a scan from point 23$b$-4 through point 23$b$-128, the terminal point in the preferred embodiment. Also, the A scanner switch arms of modules M2-M8 are all stepped to their contact points 23$b$-4, while the B scanners of modules M2-M8 are disconnected from their stationary contacts, whereupon pulses from a clock pulse source are simultaneously applied to each module for simultaneously advancing the switch arms of all the A scanners in modules M1-M8. As was described hereinabove, the scan of each A scanner continues until a continuity condition is detected or until a Terminal Count is reached. When scanning of all modules has temporarily halted due to one of the two above conditions (Terminal Count or continuity), the aforementioned logical gating circuitry apprises the MPU 15 of this condition, and the MPU, through the program subroutine of ROM 11, causes a polling of all modules M1-M8, whereupon modules indicating a Terminal Count are skipped over and modules having a continuity detection indication are caused to have the addresses associated with those stationary contact points at which the A scanner switch arm is located, sequentially transferred to RAM 12 in the manner set forth hereinbelow. The scans are continued in this manner until each point in module M1 has been scanned for continuity with every other point. The process is sequentially repeated for modules M2-M8, such that all points have been scanned for continuity for every other point. It will be noted that when the module M2 is being scanned in the manner previously described for M1, the A scanner contacts of module M1 need not be scanned again since any continuity between points in module M2 with points in module M1 would have been detected during interrogation of module M1. Likewise, during interrogation of all higher modules, the A scanner contacts of all lower modules are not scanned.

Comparing this technique with the serial technique described in copending application Ser. No. 968,820, the scan time for the serial technique as described in copending application Ser. No. 968,820 is given by:

Scan time = $[n(n+1)/2]$ D, where n = the number of points per system;

D = dwell time.

As an example, where n = 1,024 and D = 10 microseconds, Scan Time = $[1,024(1,024+1)/2]$ $10^{-5}$, or Scan Time = 5.25 seconds.

Comparing this against the parallel technique, Scan Time = $n \times D \times P$, where n = number of points in system;

D = dwell time on each point; and

P = number of points per board.

Given the same example, i.e., where n equals 1,024, D equals 10 microseconds, and P equals 128, then Scan time = $1,024 \times 10^{-5} \times 128$, or Scan Time = 1.3 seconds.

It should further be understood that the number of points per module need not be limited to 128, but can be greater or smaller in number. The total scan time can obviously be further reduced if fewer points per board are scanned simultaneously. For example, where n=1,024, D=10 microseconds, and P=64, Scan Time = $1,024 \times 10^{-5} \times 64$, or Scan Time = 0.655 seconds.

The learning operation can thus be completed in well below 1.5 seconds for a parallel scan technique scanning 1024 points.

Once the known good harness has been learned, i.e., once data representative of all of the interconnections has been stored into RAM 12, testing of a harness may be undertaken.

Although learning of a harness can be done in the manner described hereinabove, it is also possible to load RAM 12 from an external source, i.e., a tape cassette. A tape cassette having the FSK information stored therein is placed in the read out mode and has its output plug connected to the recorder in jack which couples the signals to FSK demodulator 35. The signals are derived from the tape in FSK format, wherein the binary "0" state is represented by a 3 kHz signal and the binary "1" state is represented by a 1.5 kHz signal. The FSK demodulator 35 demodulates the two signals as will be described in greater detail hereinbelow, to present received data in a binary non-return to-zero (NRZ) format to one input 14b of ACIA 14 and further derives a synchronizing clock signal from the FSK input and applies this signal to the receive clock R CLK input 14c of a PIA 14. As is described in great detail in corresponding application Ser. No. 968,820, the demodulated data is shifted into a register in PIA 14, a parity bit is locally generated, a parity check is performed against the received parity bit, and the data word is then shifted out in parallel to the proper address in RAM 12, if the parity check condition is met. Read-in of data to RAM 12 in this fashion takes less than one minute. This design greatly enhances the versatility of system 10 since it is possible to prepare a system for testing multiconductor harnesses without the actual physical presence of a known good harness. The data may, in fact, be transmitted to a remote location over a dedicated wire transmission line or through wireless transmission techniques, received at the remote location, stored in a tape cassette, and then transferred from the tape cassette at the remote location to the RAM 12 of the system 10 provided at the remote location in the manner described hereinabove.

In a similar fashion, a tape can be prepared by system 10 by coupling the output of FSK modulator 36 to the input of a recorder which is placed in the write or record mode. Each data word is transferred from RAM 12 to ACIA 14 in parallel fashion, and then is transferred in non-return to zero format through the T DAT line 14a to FSK modulator 36. A 3 kHz signal and a 1.5 signal are applied to the remaining inputs of FSK modulator 36 and, depending upon the binary state of the transmit data line T DAT, one of the two frequencies is transferred to output 36a, thereby converting data words from RAM 12 into FSK format. The ACIA 14 adds a start bit (always binary "0"), develops an even parity bit which is transmitted immediately after transmission of the eight data bits, and further adds a stop bit (always binary "1") to the data word format applied to the data input terminal of FSK modulator 36.

Thus, tape cassettes may be prepared by the system for shipment to a remote facility or for transmission over any suitable telemetry medium to a remote facility, thereby greatly enhancing the versitility of the equipment. The system 10 is also provided with a baud rate generator for operating a printer to provide a print out of the data in RAM 12 as well as providing a print out of an error list, as will be more fully described.

When a known good harness has been learned in the manner described hereinabove (i.e., when its interconnections have been stored in RAM 12), it is now possible to test completed harnesses against the known good harness. This is accomplished by connecting end points of the harness to be tested into the appropriate connection points of the system 10 and then operating the mode select switch 22 to the test mode. In this mode, the scanning sequence is substantially identical to that described above, except that comparison operations are performed to ascertain the correctness of the harness under test.

As was described hereinabove, the B scanner of the M1 module has its switch arm 24a advanced to stationary contact position 24b-2. The switch arm of A scanner 23 is advanced to stationary contact position 23b-2, whereupon switch arm 24a is stepped in the reverse direction to contact position 24b-1. The switch arms of the B scanners in modules M2–M8 are maintained in a position in which the switch arms are disconnected from any stationary contact points, while all of the A scanners of modules M2–M8 have their switch arms moved to their first stationary contact points (equivalent to point 23b-1).

The system clock pulse source (to be more fully described) is then energized, causing the switch arms of the A scanners in modules M1–M8 to be simultaneously scanned. A strobe pulse is developed when the switch arm 23a of each module M1–M8 engages such stationary contact, to test for continuity. Scanning of the A scanner for each module is temporarily terminated either upon the occurrence of a Terminal Count or upon the occurrence of a continuity condition. As soon as all of the A scanner switch arms for all modules M1–M8 have temporarily halted, a signal developed by the aforementioned logical gating circuitry (not shown) indicates this condition to MPU 15, causing MPU 15, under control of the subroutine provided in ROM 11, to poll each of the modules in sequential fashion, skipping over those modules having a Terminal Count, and comparing the address of the A scanner point in the module being polled against the data stored in RAM 12 at an address location corresponding to the address of the B scanner stationary contact under test. If the contents of this address compares with the address of the A scanner point which indicates a continuity condition, this comparison operation indicates a correct interconnection in the harness under test. The A scanners for the remaining modules are polled in a similar fashion and their points at which continuity conditions have been detected are compared against the contents of the next successive addresses in memory (in the case of multiple connections, to a single point), whereupon the A scanners of the modules M1–M8 are caused to reinitiate their scans until they have all arrived at a Terminal Count, at which time the B scanner of module M1 is advanced in the manner described hereinabove, and the scan for testing a harness is continued until all points on module M1 have been scanned. The process is repeated for modules M2–M8 so that all points have been scanned.

In the event that an open circuit condition is detected, it should be understood that the contents of the address presently being examined is the same as the address of the memory location indicating an open circuit (i.e., no continuities).

In the event that there is a lack of comparison as between points of the harness under test and points of the known harness in the form of the data stored in RAM 12, the MPU 15 is caused to jump to an error display subroutine. For example, assuming that the harness under test indicates a continuity between two points, while the associated address in RAM 12 indicates an open circuit between these points, the display, at the left-handmost numeric LED 39 displays the alphabetic letter "S", indicating a short circuit condition, while the sets of numeric LED's 37 and 38 display the two points which are shorted to one another. Obviously, in the reverse case where an electrical connection between two points is called for and an open circuit has been detected, the left-hand numeric LED 39 will display the letter "O", while sets 37 and 38 of the numeric LED's will indicate the points between which the open circuit has been detected.

As was mentioned hereinabove, for a system capable of scanning 1,024 points, the entire scan is completed in 1.3 seconds.

System 10 may be operated in a MONITOR mode to aid in the assembly of multiconductor harnesses. The mode selection switch 22 is moved to the MONITOR position and a scan is performed. As was mentioned hereinabove, and also as is described in detail in copending application Ser. No. 968,820, the switch means is designed to vector the system to the first program step where the MPU 15 searches for the status of the mode select switch 22 and upon determining which mode has been selected, jumps to the appropriate program subroutine. In this case, the subroutine in ROM 11 selected by MPU 15 performs a test of the points, as the harness is being assembled, for purposes of comparing the results of the test against data representing the known good harness which data is stored in RAM 12. The MONITOR subroutine however, is somewhat different from the TEST subroutine in that open circuit conditions are ignored, for obvious reasons. In the event that an incorrect wiring connection is made by the assembler, the short circuit indication is indicated by energizing internal speaker 43 to sound an audible tone. This scheme provides the assembler with an immediate indication of the erroneous connection, the numeric LED's providing an indication of the incorrectly connected points.

The assembler may then take immediate action to correct the improper wiring connection, whereupon the correction of the erroneous short circuit condition allows the monitor mode to continue.

The system is also capable of testing for momentary or spurious short circuit conditions by allowing the MONITOR subroutine to recycle itself on a repetitive basis. Thus, if a momentary or spurious connection is detected, the display will occur. Once the spurious connection is removed, the test will be immediately reinitiated and, upon completion, will again be immediately recycled over and over again to test for the possible reoccurrence of the spurious condition.

As was mentioned hereinabove, there are eight modules M1–M8. A detailed description of the circuitry provided on each module will now be given. Considering FIG. 2, there is shown therein the logical circuitry provided in one such module, it being understood that the remaining modules are substantially identical in both design and function. In addition to the circuitry shown in FIG. 2, it should also be understood that an A scanner and a B scanner are incorporated in each module M. The A and B scanners and the decoders for addressing the A and B scanners are substantially identical to those shown in FIG. 4d of the aforementioned copending application Ser. No. 968,820, except that, in the present invention, the V+ signal is applied to the switch arm 24a of the B scanner, and the continuity detector is coupled to the switch arm 23a of the A scanner.

Figure 2:
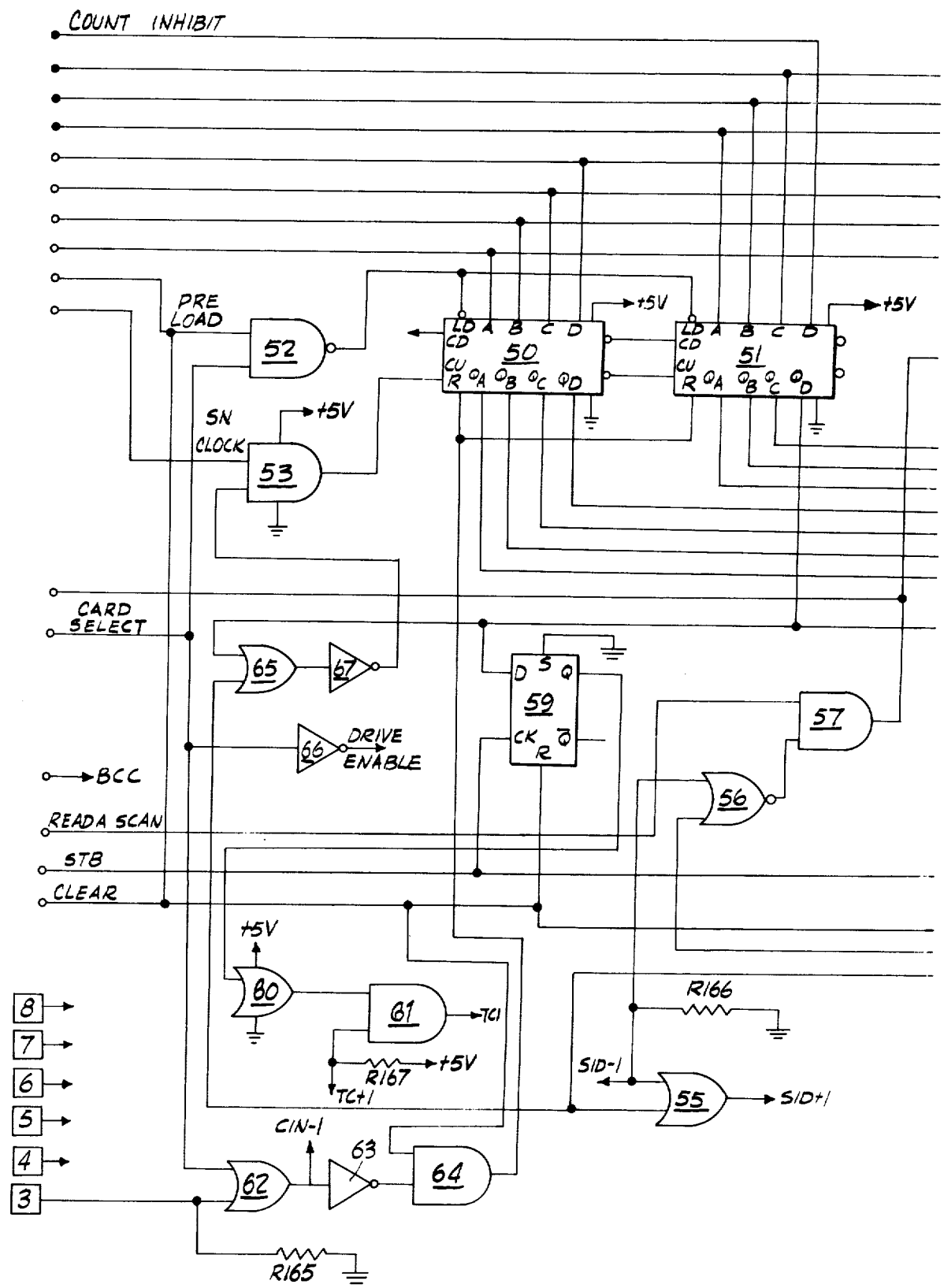
FIG. 2 shows a block diagram of the scanning control circuitry provided on one module of the system of FIG. 1.
Figure 2:
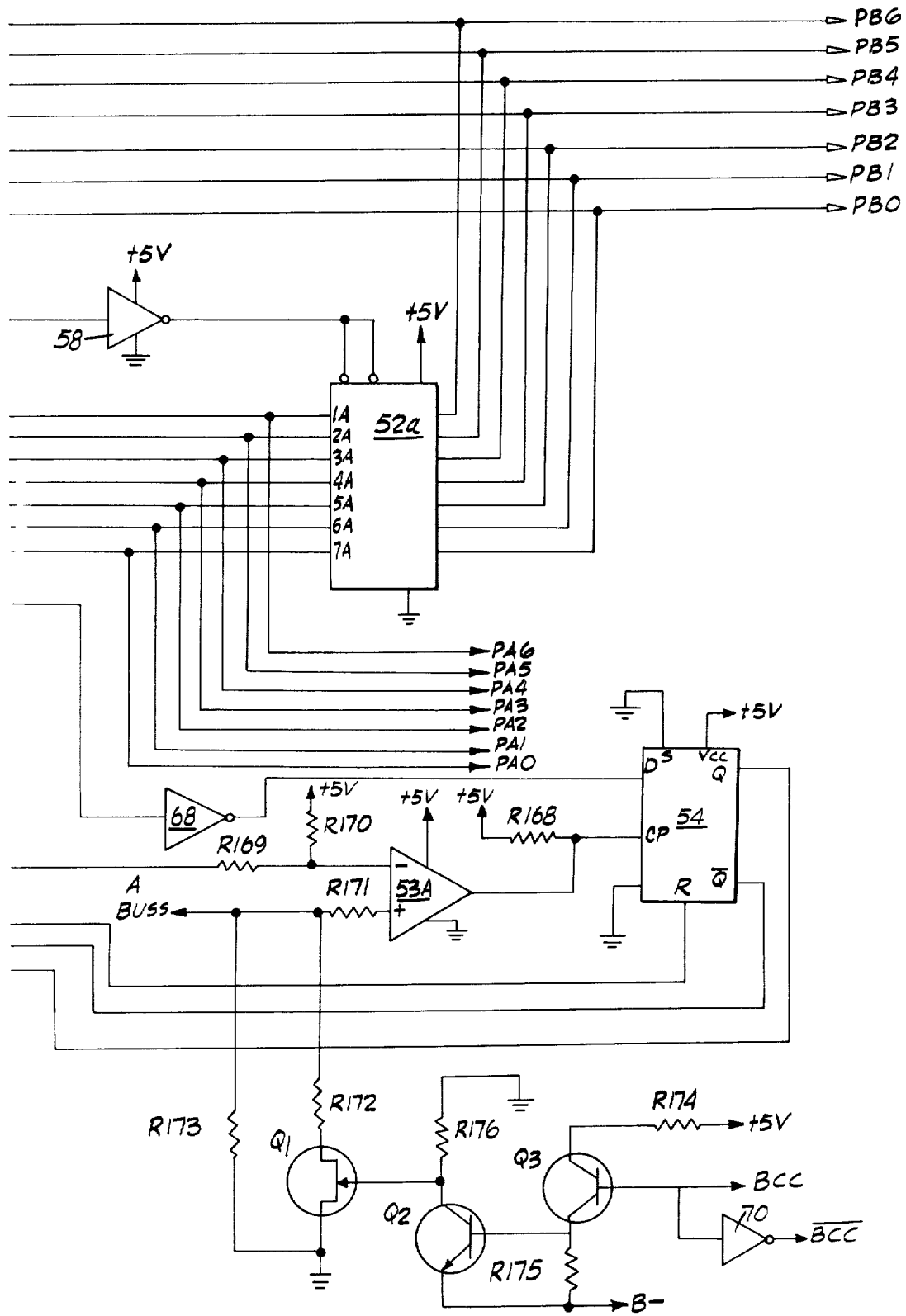

Considering now FIG. 2, the PIA 13, under control of the MPU 15, places a plurality of binary level signals on respective ones of lines PB0–PB6. Lines PB0–PB6 are connected in common to all eight modules M. Lines PB0–PB3 are connected to respective inputs of up/down counter circuit 50, while lines PB4–PB6 are connected to respective inputs of up/down counter circuit 51. The two counter circuits 50 and 51 together form a decimal digit counter capable of counting from 0 through 99 (for an example in which each module is provided with 64 points).

In the manner described hereinabove, and assuming a cycle is just about to begin, PIA 13 places binary signals representative of the count "2" (i.e., stationary contact 24b-2) on lines PB0–PB6. MPU 15 then causes PIA 13 to let out a preload signal which is applied to one input of NAND gate 52. The remaining input of gate 52 is derived from a decoder (not shown) controlled by PIA 13 which serves to select the module M upon which gate 52 is provided. Upon selection of gate 52, and upon occurrence of the preload signal, gate 52 simultaneously applies a preload pulse to the load (LD) inputs of counters 50 and 51, loading the count ("2") appearing on lines PB0–PB6 into the counters 50 and 51. The PIA 13, under control of MPU 15, then reduces the count on lines PB0–PB6 by one and thereupon triggers the operation of a synchronizing clock, such as the clock 20 shown in FIG. 1, to pass pulses to the count-up (CU) input of counter 50. The counters 50 and 51 collectively operate to count up (in binary form) from the count of "2" to the count of "64". The outputs QA–QD of counters 50 and 51 are simultaneously applied through lines PA0–PA6 to a decoder circuit (see FIG. 4d of copending application Ser. No. 968,820) and to the steering inputs of the analog switches comprising the A and B scanners (also shown in FIG. 4 of the aforesaid application Ser. No. 968,820) in the following manner:

Considering FIG. 4d of the aforementioned copending application Ser. No. 968,820, the output lines PA0–PA2 are coupled to the selection control lines of the analog switches forming the A scanner. Lines PA3–PA6 are directed to decoder means 93a for converting the four bit binary code into a one out of 16 output line, whose outputs are respectively coupled to the inhibit inputs INH of each of the analog switches making up the A scanner, causing only one of the analog switches to be enabled while the remaining 15 analog switches are maintained in the inhibited state. The PA0–PA2 binary control signals select which of the output lines of the analog switches will be coupled to their common line COM. The PB0–PB2 lines are coupled to the output selection control lines A, B and C, respectively, of the analog switches which comprise the B scanner, while the lines PB3–PB6 are coupled to a second decoder 93b for selecting one of the 16 analog switches comprising the A scanner.

The B buss, as was mentioned hereinbefore, is coupled to the V+ signal to apply the test voltage through the B buss, the resistor coupling the common input COM of the analog switch, and the selected output line of the analog switch which is coupled through a resistor element to the connector socket arranged along one side wall of the system as shown, for example, in FIG. 2 of the aforementioned copending application Ser. No. 968,820.

The A scanner analog switches 47 are scanned at high speed on a one at a time basis in the manner described hereinabove by controlling the PA0–PA2 signals and by controlling the PA3–PA6 signals so as to scan the lines of each analog switch and to scan each switch, thereby sequentially connecting each connection point to the A buss (FIG. 2 herein) which is coupled to the noninverting input of the comparator amplifier 53A. The inverting input of amplifier 53A is coupled to receive the strobe input STB from the PIA 13, which signal goes low when the A scanner steps to the next point. In the event that a continuity condition is detected, this condition is latched into flip-flop 54. The Q output of flip-flop 54 is coupled to one input of gate 55. The Q output is coupled to one input of gate 56, whose output is coupled to one input of AND gate 57. The output of AND gate 57 is coupled to the priority decode circuitry which indicates which of the modules is being read. The output of gate 57 is also coupled through inverter 58 to the latching input 52a of tristate device 52A.

In the event that a continuity condition is detected, the setting of flip-flop 54 causes the output of counters 50 and 51 to be latched into tristate device 52A and to appear at its output terminals 1Y–7Y so as to be made available at the lines PB0–PB6. This occurs only upon the presence of a READ A SCAN signal applied to the remaining input of AND gate 57 which permits the count appearing at the output of counters 50 and 51 to be transferred to the PB0–PB6 lines only when the module shown in FIG. 2 is being polled by the MPU 15.

In the event that the module M, whose A scanner is being advanced, fails to detect any continuity conditions, then its counter will step to maximum count and will develop a binary "1" at the $Q_D$ output of counter 51. The level change at this terminal is applied to the D input of terminal count latch flip-flop 59. The Q output of flip-flop 59 is coupled to one input of OR gate 60 whose remaining input is coupled to the Q output of continuity latch flip-flop 54. When either of these conditions occur, OR gate 60 applies an enable signal to one input of AND gate 61. The output of AND gate 61 is coupled to the input of a like AND gate 61 on the lower order module. For example, in assuming the circuitry of FIG. 2 as being provided in module M8, the output of AND gate 61 would be coupled to the remaining input of a gate 61 forming part of the module M7. These interconnections are repeated through to module M1, except that the gate 61 of module M1 is connected to the interrupt line to provide an interrupt signal to the MPU 15 indicative of the fact that all modules M1–M8 have either reached a Terminal Count or have detected a continuity condition, causing the MPU 15 to begin a poll of all modules. The continuity condition appearing at the Q output of latch flip-flop 54, which is coupled to one input of OR gate 55 and OR gate 60, is further coupled to one input of OR gate 65 whose remaining input receives the Terminal Count from the $Q_D$ output of counter 51. In the event that either a terminal count or continuity has been detected, the output of OR gate 65 goes high. This condition is inverted by inverter 67 to provide a low level to AND gate 53, preventing any further clock pulses from being passed to counter 50.

When each module is being polled, a CARD SELECT SIGNAL is applied to the CARD SELECT LINE. This signal is simultaneously applied to one input of NAND gate 52, to inverter 66, and to one input of OR gate 62. The remaining input of OR gate 62 is coupled to the output of a like gate 62 provided in the module of the next higher order (M+1). The output of OR gate 62 is coupled to a like input of an OR gate 62 in the module of the next lower order (M−1). Thus, if a card select signal is applied to any module, the output of the OR gate 62 goes high and is also fed to modules of the next lower order (M−1) to disable the lower order modules. This is accomplished by inverting the high level through inverter 63 to disable AND gate 54 and thereby prevent a signal applied to the CLEAR line from being passed by gate 64 to the reset inputs R of counters 50 and 51.

The presence of the continuity condition is applied to one input of OR gate 55 whose output is applied to the input of a like OR gate 55 provided in the module of the next higher order. Similarly, the remaining input of OR gate 55 receives the output of a similar OR gate 55 provided in the module of the next lower order (M−1). This signal, in addition to being applied to one input of OR gate 55, is applied to one input of NOR gate 56 which serves to disable AND gate 57 and prevent the count at the output of counters 50 and 51 from being passed by tristate device 52 to the common lines PB0–PB6 so as to be transferred from common lines through PIA 13 to the proper address location in RAM 12. The presence of a signal on the CLEAR line is coupled: into the reset input R of terminal count latch flip-flop 59; through AND gate 64 to the reset inputs R of counters 50 and 51; and to the reset input R of the continuity latch flip-flop 54. The strobe line STB, in addition to applying a negative going strobe pulse to the inverting input of comparator amplifier 53A, also applies a clock input to terminal count latch flip-flop 59 to latch in the terminal count after the last strobe operation. The continuity latch flip-flop 54 is caused to reset upon the occurrence of the terminal count which is inverted by inverter 68 and applied to the D input of continuity latch flip-flop 54.

The sensitivity of the comparator amplifier 53A may be adjusted by the transistor circuitry comprised of field effect transistor Q1 and the transistors Q2 and Q3. When a body conductor is being utilized by an operator to identify a conductor picked up by the operator, the B.C.C. mode is selected, causing a low level signal to be applied to the base electrode of Q3 causing its emitter electrode to go more positive. This results in the conduction of Q2 causing its collector electrode to go more negative. As a result, the field effect transistor Q1 turns off to couple a very high ohmic resistance R173 between the A buss and ground potential, providing comparator amplifier 53A with a high sensitivity. In the event that a body conductor cable is not being employed, the base electrode of Q3 goes low to turn Q3 off. This, in turn, causes Q2 to turn off, whereupon the collector electrode of Q2 goes high to turn the field effect transistor Q1 on. This places resistor R172, having a much lower ohmic value, in electrical circuit between the A buss and ground potential, thus significantly reducing the sensitivity of comparator amplifier 53. A body conductor cable is connected to the wrist of the operator through a conductive wrist band. Thus, by selecting the B.C.C. mode, any cable end which is touched by the fingers of the operator causes a current in the microampere range to be applied to the cable for cable identification purposes and the like. The operator's hand is thus part of the conductive path. By removal of the body conductor cable signal level, the sensitivity of the comparator amplifier is reduced when operating in the Test and Monitor modes described hereinabove.

Figure 4:
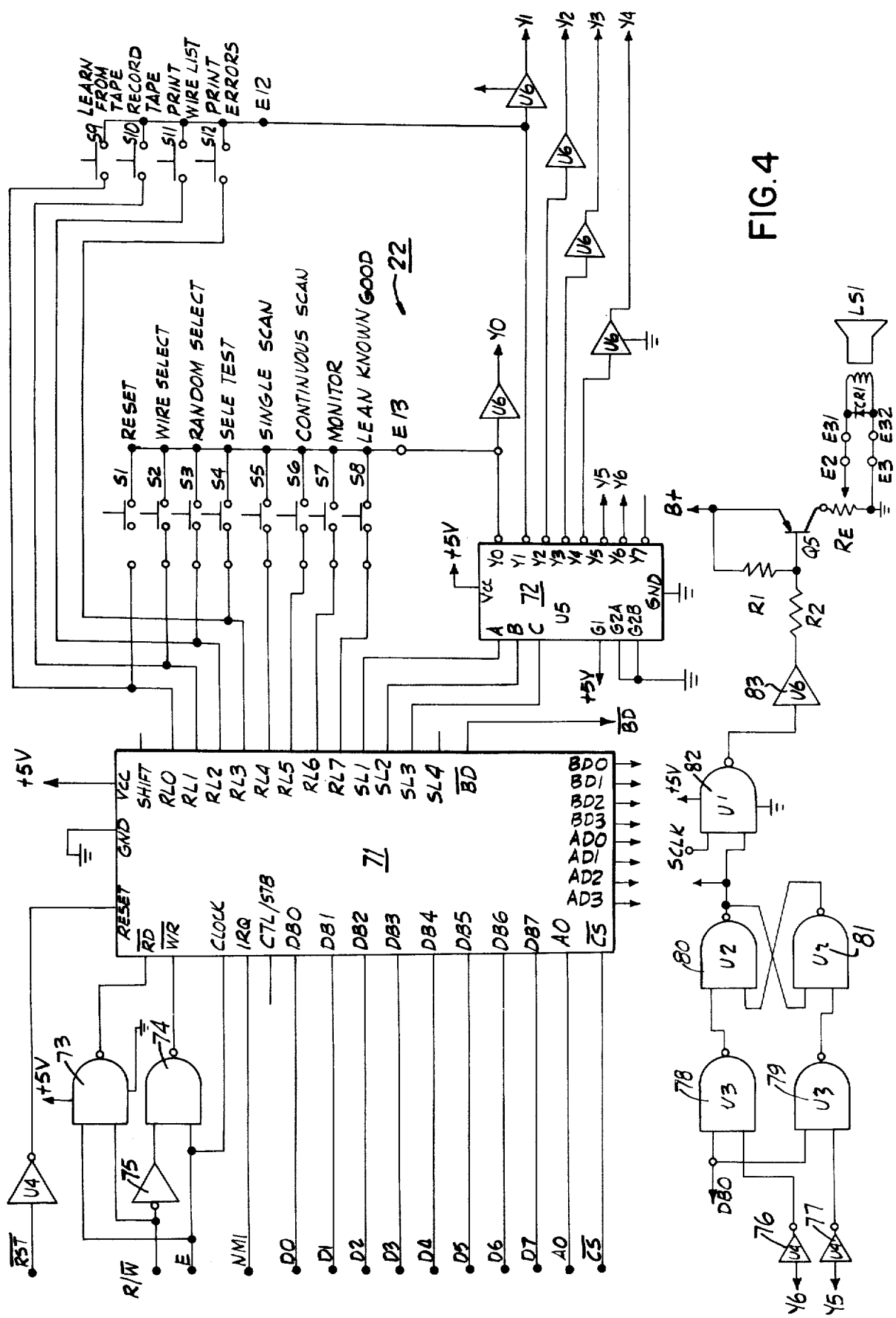
FIG. 4 shows a block diagram of the mode selection circuitry and displaying drive circuitry of FIG. 1 in greater detail.

With reference to FIG. 4, the mode selector switch shown in simplified fashion in FIG. 1 is, in the preferred embodiment, comprised of a microprocessor chip and is preferably an INTEL Model No. 8279. The mode selector switch in the preferred embodiment further comprises a plurality of push button switches shown as S1–S12 (FIG. 4), each capable of selecting one of the 12 operating modes for the system. The microprocessor chip 71 selects the push buttons in a time multiplexed fashion and receives each of the input switch conditions by way of receive line inputs RL0–RL7. The multiplex technique employed by MPU 71 together with a double key rollover capability, prevents the simultaneous depression of two or more of the push button switches from being erroneously interpreted as being received simultaneously and allows only one of the switch depressions to be transferred to MPU 15.

The MPU chip 71 transfers the selected mode condition which has been detected to the MPU 15 to cause selection of the appropriate software subroutine in ROM 11.

The MPU chip 71 is also capable of receiving data on its data lines DB0–DB7, which data is transmitted through its send lines SL1–SL3 to cause decoder 72 to select the lines Y1–Y4 in a sequential fashion. Lines Y1–Y4 are coupled to the cathodes of the numeric LED's for operation thereof in a time division multiplexed fashion. Line Y1 is preferably coupled to the least significant digit positions of the sets 37 and 38, line Y2 is connected to the next higher digit position of the sets 37 and 38, and so forth. The lines AD0–AD3 and the lines BD0–BD3 are utilized to operate 4–7 type decoders which, as were described in connection with the system of the aforementioned copending application Ser. No. 968,820, and are adapted to convert a four bit binary code (BCD) into a seven segment output code for illuminating the proper numeral in accordance with the inputed four bit binary code.

In conjunction with this operation, the system 10 may be operated to provide a print out of all detected errors by operation of the print error switch S12. Print out of all of the data representing the known good harness stored in RAM 12 may be obtained by depressing the print wire list switch S11.

In order to obtain the audible alarm, two of the outputs Y5 and Y6 of decoder 72 are coupled through inverters 76 and 77 to gates 78 and 79, whose outputs are coupled to gates 80 and 81. The output of gate 80 is coupled to one input of NAND gate 82, whose remaining output is coupled to the system clock S CLK, which is preferably a 0.75 kHz signal. The output of NAND gate 82 is coupled through inverter 83 to the base electrode of transistor Q5. The internal speaker LS1 is coupled across the adjustable transmitter resistor $R_E$ having an adjustable arm for controlling the output volume of the internal speaker LS1.

In order to activate internal speaker LS1, the Y5 and Y6 outputs of decoder 72, which decoder is scanned at the time division multiplex rate described hereinabove for the LED display, are caused to drive the output of gate 80 alternately high and low to selectively pass the S CLK signal to the internal speaker LS1.

Operation of the Self Test push button S4 causes selection of the Self Test mode which initiates performance of a complete scan to test the system 10 for the presence of any erroneous continuity or open circuit conditions prior to performance of a test on a harness or prior to performance of a MONITOR mode in conjunction with the assembly of a harness. The scan during the Self Test procedure is the same as that employed during a TEST mode. Thus, each module M1–M8 should reach Terminal Count indicating that there are no spurious faults or open circuits within the system. This test should also be performed before learning from a known good harness or before performing a test mode in order to be assured that the equipment is functioning properly.

By coupling a known good harness to the connectors of the system and depressing switch S8, all of the interconnections of a known good harness may be entered into RAM 12.

In order to test a completed harness against a known good harness, whose data is stored in RAM 12, push button S5 is depressed to complete a scan, wherein the single numeric LED 39 is caused to illuminate a "P" ("PASS") in the event that the comparison proves successful. As was described hereinabove, in the event that any open circuit conditions and/or continuity circuits fail to compare, the single numeric LED 39 is operated to present an illuminated "O" or "S", depending upon whether the error condition is respectively open or a short circuit condition. The numeric LED sets 37 and 38 display the contact numbers of the contact points in error.

Depressing the monitor switch S7 permits monitoring of a harness assembly operation wherein the software program selected ignores all open circuit conditions. By selecting the continuous scan mode through depression of switch S6, (for detailing the presence of momentary of spurious continuity conditions which appear only briefly and are corrected), the full scan is repeated again and again as an aid in determining the cause of the momentary error.

When a test has been completed, the system will remain operable until reset. Depressing the reset switch while in the test mode permits the initiation of a new test by starting at the beginning of the testing program in memory.

By depressing the Learn From Tape Switch S9, data representative of a known good harness may be transferred from a tape cassette (not shown) to RAM 12. Data stored in RAM 12 may be transferred to a tape cassette by depressing the record tape switch S10.

It should be noted that the switches S1–S8 all have one terminal thereof coupled to the Y0 output of decoder 72 which operates under control of the time division multiplexing signals. One terminal of the switches S9–S12 are similarly coupled to the Y1 output of decoder 72. Thus, the push button switches may be seen to be operable in a multiplexed fashion in much the same manner as the numeric LED's to permit a larger number of push button switch selections even though the number of receive line inputs provided in the MPU may be limited.

Figure 3:
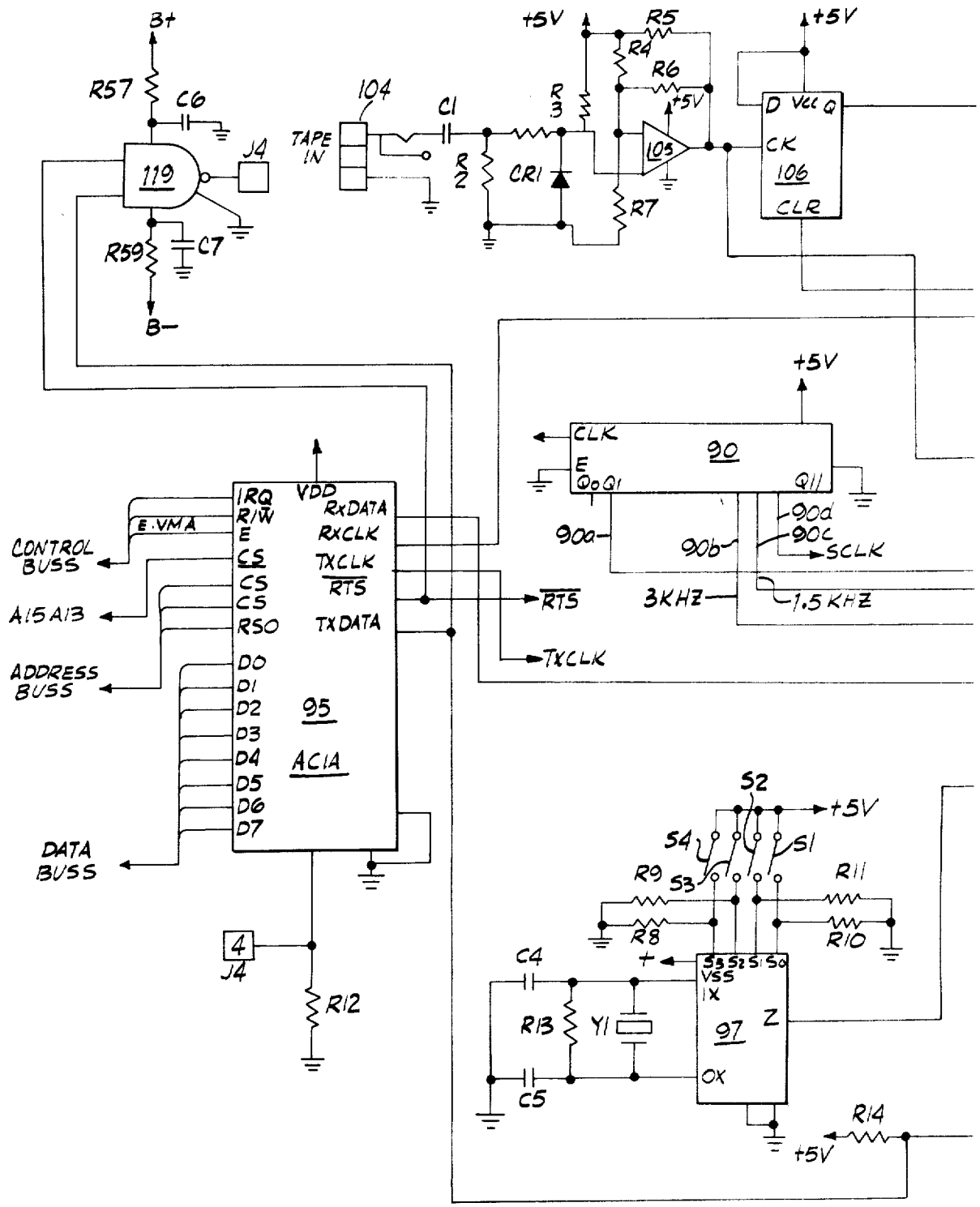
FIG. 3 shows the modulator and demodulator circuitry employed in the system diagram of FIG. 1 in greater detail.
Figure 3:
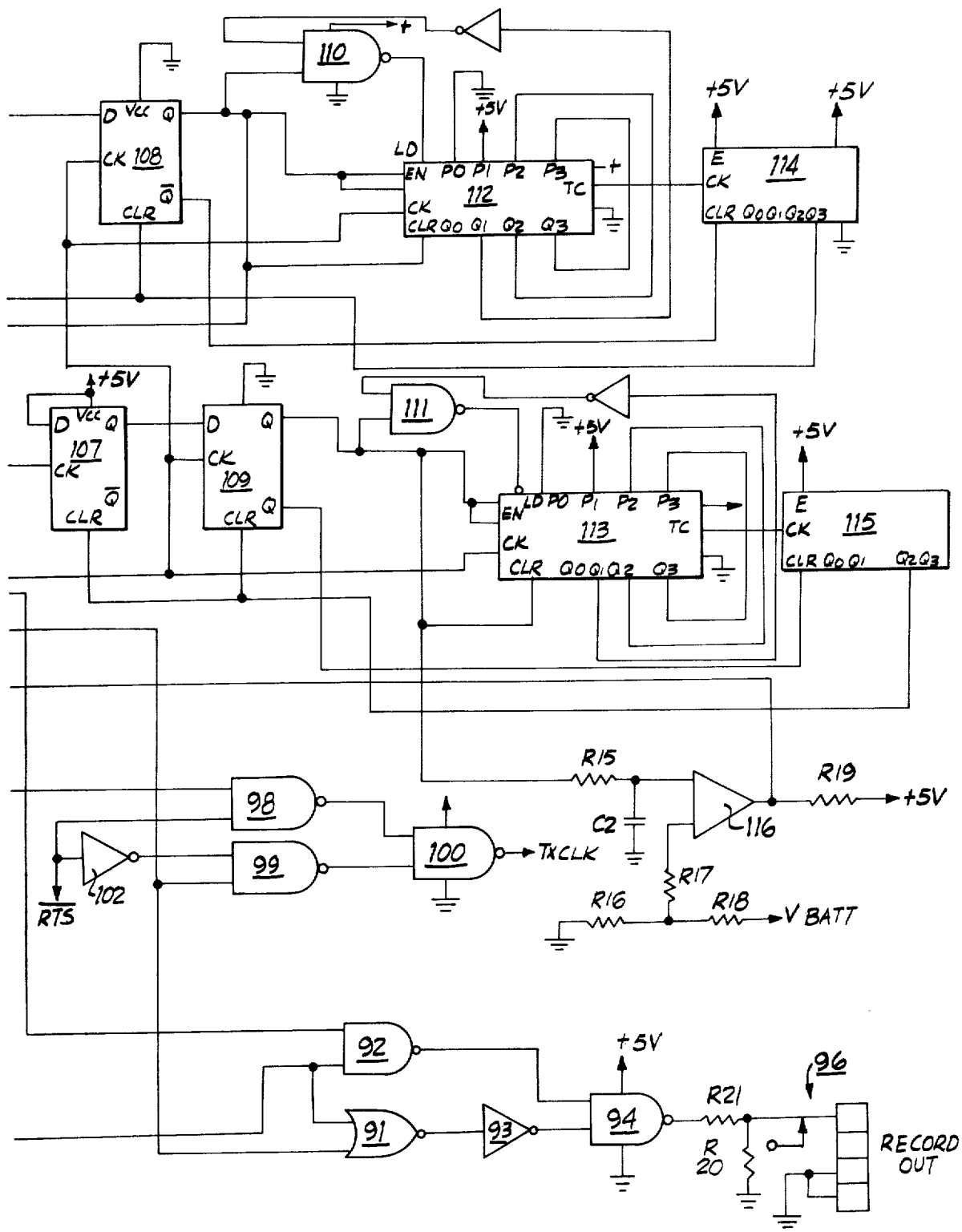

FIG. 3 shows the circuitry employed for demodulating FSK signals from a tape cassette; for generating FSK signals for transfer to a tape cassette, and for controlling a printer for the purpose of printing either the entire wire list or the list of errors encountered during a test operation.

Conversion of the data in RAM 12 for transfer to a tape cassette is accomplished by means of counter 90 which divides the output of the system oscillator down to a 3 kHz signal at its output 90b and to a 1.5 kHz signal at its output 90c. A 0.75 kHz signal is developed at output 90d (line S CLK) which is applied to one input of and gate 82 shown in FIG. 4 for driving internal speaker LS1 to provide the desired audible alarm.

The 3 kHz output is applied to one input of NOR gate 91. The 1.5 kHz output line is coupled to one input of NAND gate 92. The remaining inputs of NOR gate 91 and NAND gate 92 are coupled in common to the transmit data output of integrated circuit 95 which forms a part of the asynchronous communications interface adapter 14. Data is presented to circuit 95 at its input lines D0-D7 in parallel fashion and appears in serial fashion at output line Tx DATA to be coupled in common to one input of gates 91 and 92. In the presence of a binary "0" level, the transmit data line Tx DATA goes low, causing a 3 kHz signal to be passed by NOR gate 91, inverter 93, and NAND gate 94 to be transferred to the recorder through the record out phone jack 96. In the presence of a binary "1" state, gate 91 is disabled, while gate 92 is enabled to pass the 1.5 kHz signal which further passes through gate 94 to the record out phone jack 96.

In the event that it is desired to transmit data over a communications link in accordance with a predetermined baud rate, a baud rate generator 97 is provided. The operating frequency of baud rate generator 97 is determined by the crystal element Y1 and by the setting of switches S1-S4. The output of the baud rate generator is coupled to one input of NAND gate 98. The remaining input of NAND gate 98 is coupled to output RTS of the asynchronous communications interface adapter 95 which couples the same signal, but inverted, to one input of gate 99, by means of inverter 102. Gates 98, 99 and 100 select which of the clock signals developed by baud rate generator 97 and developed by counter 90, are passed by the output of gate 100 to either record on tape or operate the printer.

The tape-in circuit is comprised of a phone jack 104 for receiving the output plug of a tape recorder. The signal from the tape cassette being played by the tape recorder is applied to operational amplifier 105 which squares up the incoming FSK signals and simultaneously applies the incoming FSK signals to the clock inputs CK of flip-flops 106 and 107.

The Q outputs of flip-flops 106 and 107 are coupled to the D inputs of flip-flops 108 and 109, respectively. The Q outputs of flip-flops 108 and 109 are coupled in common to one input of gates 110 and 111, the enable input EN of counters 112 and 113, and the clear inputs CLR of counters 112 and 113. The Q output of each flip-flop 108 and 109 is coupled to the clear input CLR of counter stages 114 and 115, respectively.

The Q output of flip-flop 108 is also coupled to the receive clock input Rx CLK of the asynchronous communications interface adapter 95. The Q output of flip-flop 109 is coupled to the inverting input of operational amplifier 116.

The counters 112-114 and 113-115 are hard-wired so as to provide divide by 96 and divide by 48 counts, respectively. The flip-flops 106 and 107 divide the signals applied to the clock inputs by two. The bistable flip-flops 106 and 107 are caused to trigger on the positive-going edge of either the 1.5 kHz or the 3 kHz signal. The Q outputs of 106 and 107 go high and are set into the bistable flip-flops 108 and 109 by the next occurring clock pulse derived from output 90a of counter 90 which has a frequency rate of 192 kHz. The Q outputs of flip-flops 108 and 109 go high to apply high levels to the enable inputs EN of counters 112 and 113. Flip-flops 106 and 107 serve as buffers to store the occurrence of the positive going edge until receipt of the next clock pulse, at which time the state of the Q outputs of 106 and 107 are set into flip-flops 108 and 109, respectively. The counters 112 and 113 are wired to count up to counts of 96 and 48, respectively, before applying reset pulses appearing respectively at the Q3 and Q2 outputs of counters 114 and 115, which reset pulses are applied to the clear inputs CLR of the bistable flip-flops 106, 108 and 107, 109, respectively. The resetting of flip-flops 106 and 108 causes the flip-flops to be reset on either every other positive going edge of the 3 kHz signal or every positive going edge of the 1.5 kHz signal so that the signal appearing at the Q output of flip-flop 108 has a frequency of 1.5 kHz.

In the case of counters 113 and 115, which accumulate a count of 48 and then reset flip-flops 107 and 109, the signal appearing at the Q output of flip-flop 109 has a frequency rate of 3 kHz. The Q output of flip-flop 109 is coupled to the inverting input of operational amplifier 116. The signal charges capacitor C2 during the presence of the high level of a 3 kHz signal, capacitor C2 charges at half the rate and discharges during each low level of the 3 kHz (occurring each half-cycle of the 3 kHz signal). When capacitor C2 charges to the level applied to the non-inverting input (occurring only during the presence of a 1.5 kHz FSK signal), the output of the operational amplifier 116 goes low to apply a binary "0" state to the receive data input Rx DATA of the asynchronous communications interface adapter 95. When the higher frequency rate (3 kHz signal) appears at the Q output of flip-flop 109, capacitor C2 is prevented from charging to the level applied to the non-inverting input causing the output of the operational amplifier 116 to remain high thereby applying a high level to the receive data input Rx DATA of ACIA 95. Thus, the demodulator provides a solid state digital circuit which is adapted to extract the synchronizing clock and data from the received FSK signal derived from the tape cassette for controlling shifting of data bits into the asynchronous communications interface adapter for conversion into parallel from and, after successful completion of a parity check, for transfer in parallel to RAM 12.

When the system is placed in the print mode, the data is transferred in serial fashion from the transmit data output Tx DATA to NAND gate 119 for transfer to a printer register. The output line RTS is high when print out is called for to enable gate 119, and is low when data is being transferred from RAM 12 to tape cassette, to disable data from being transferred to the printer.

Although this invention has been described with respect to its preferred embodiments, it should be understood that many variations and modifications will now be obvious to those skilled in the art, and it is preferred, therefore, that the scope of the invention be limited, not by the specific disclosure herein, but only by the appended claims.

What is claimed is:

1. Apparatus for testing a test multiconductor harness having a plurality of end points against a known good multiconductor harness having a plurality of end points, said apparatus comprising:

storage means for storing information representative of circuit conditions existing between said plurality of end points established by the conductors of said known good multiconductor harness;

testing means for connection separately to each such harness for simultaneously applying a signal to preselected groups of said plurality of end points of such connected harness;

detection means for connection to such connected harness and responsive to such signal for determining circuit conditions existing between such preselected groups of said plurality of end points of such connected harness;

transfer means connected to said detection means and said storage means for transferring information representative of said circuit conditions of the conductors of said known good multiconductor harness to said storage means;

comparing means connected to said detection means and said storage means for comparing circuit conditions existing between said plurality of end points established by the conductors of said known good harness with circuit conditions existing between the plurality of points established by the conductors of said test multiconductor harness;

signaling means connected to said comparing means for indicating the result of the operation performed by said comparing means; and control means for selectively operating said testing means and said transfer means when the conductors of said known good harness are connected with said apparatus and for selectively operating said comparing means and said signaling means when the conductors of said test multiconductor harness are connected with said apparatus.

2. The apparatus of claim 1, wherein said testing means comprises a plurality of scanners, each adapted to be operated simultaneously by said control means.

3. The apparatus of claim 1, wherein said testing means comprises a plurality of scanning means, each scanning means being comprised of first and second interconnected scanners.

4. The apparatus of claim 3, wherein said control means further comprises a testing signal source; means for operating one of said first scanners to couple one of said end points to said test signal source and for operating all of said second scanners to sequentially couple the end points associated with each second scanner to said detection means.

5. The apparatus of claim 1, wherein said testing means includes means responsive to said control means for coupling a test signal to one of said end points and for sequentially coupling groups of the remaining end points to said detection means.

6. The apparatus of claim 1, wherein said testing means comprises a test signal source and a plurality of scanning modules, each module having first and second scanners, each first scanner being associated with a group of end points and being adapted to couple said test signal source to one of said end points of its associated group;

said second scanners each being associated with a group of said end points and adapted to sequentially couple said detection means to the end points of its associated group.

7. The apparatus of claim 6, wherein each of said modules further comprises terminating means for terminating the scanning of its associated second scanner upon the occurrence of a detection signal.

8. The apparatus of claim 7, wherein each module further comprises terminating means for terminating the scanning of its associated second scanner when said second scanner has scanned the last end point of its associated group.

9. The apparatus of claim 7, further comprising gating means responsive to the terminating means of all of said modules for generating a polling enabling signal.

10. The apparatus of claim 8, wherein said control means further comprises means for sequentially polling each module responsive to a polling enabling signal;

said transfer means being responsive to a polling of a module by said control means for transferring the detection state of the module being polled to said storage.

11. The apparatus of claim 9, wherein said control means further comprises means for sequentially polling each module responsive to a polling enabling signal;

said transfer means being responsive to a polling of a module by said control means for transferring the lack of a detection state of the module being polled to said storage.

12. The apparatus of claim 1, wherein said control means includes a clock pulse source; said testing means further comprising a plurality of modules, each module including:

counter means controlled by said clock source for counting clock pulses;

scanner means controlled by said counter means for sequentially coupling selected ones of said end points to said detection means;

logic means responsive to operation of said detection means for decoupling said counter means from said clock pulse source.

13. The apparatus of claim 12, wherein each module further comprises logic means for decoupling said clock source from the counter of said module and for generating a TERMINAL COUNT signal when said scanner means couples the last end point associated therewith to said detection means and the the detection means associated therewith has failed to generate a detection signal.

14. The apparatus of claim 13, further comprising second logic means for generating a poll enabling signal only when all of said modules have developed either a detection signal or a TERMINAL COUNT signal.

15. The apparatus of claim 14, wherein said control means includes means responsive to a poll enable signal to sequentially poll only those modules which have generated a detection signal to activate said transfer means.

16. The apparatus of claim 13, further comprising second logic means for resetting the scanner means of each module when all of said modules have generated a TERMINAL COUNT signal.

17. The apparatus of claim 1, further comprising means for converting the data in said storage means into a serial train of frequency shift keyed signals.

18. The apparatus of claim 1, further comprising demodulator means for receiving data words serially transmitted in the form of frequency shift keyed signals and for converting said signals into binary signal levels;

means responsive to said demodulator means for transferring groups of said binary level signals to said storage means in parallel fashion.

19. The apparatus of claim 1, wherein said control means comprises microprocessor means; second memory means being selectively coupled to said microprocessor means and containing data for controlling the operation of said microprocessor means.

20. The apparatus of claim 19, wherein said second memory means comprises read only memory means.

21. The apparatus of claim 20, wherein said read only memory means comprises programmable read only memory means.

22. The apparatus of claim 1, wherein said control means includes mode selection means for selecting the operating mode of said apparatus.

23. The apparatus of claim 22, wherein said mode selection means comprises a plurality of manually operable switch means.

24. The apparatus of claim 23, further comprising microprocessor means responsive to operation of said switch means for transferring a mode request signal to said control means which mode request signal represents the switch means which has been operated.

25. The apparatus of claim 12, wherein each scanner means comprises a plurality of analog switches having a common terminal connected to an associated detection means and a group of selectable terminals, each coupled to an end point, and a first control input for enabling the analog switch, and a second group of control inputs for selectively coupling one of said group of selectable terminals to said common terminal responsive to a group of binary signals applied thereto;

decoder means responsive to the count in said counter means for enabling one of said analog switches and for applying said group of binary signals to all of said analog switches for coupling the selected line of only the enabled analog switch to the common line of the enabled analog switch.

26. The apparatus of claim 13, wherein said control means further comprises means for resetting said counter means of all of said modules, second logic means included in each module for preventing resetting of its associated counter means until the next lower order module has been reset.

27. Apparatus for testing a multiconductor harness having a plurality of end points, comprising:

storage means for storing information representative of circuit conditions required to exist between said plurality of end points;

testing means for connection to said harness for simultaneously applying a signal to preselected groups of said plurality of end points;

detection means for connection to said harness and responsive to such applied signal for determining circuit conditions existing between such preselected groups of said plurality of end points;

comparing means connected to said storage means and said detection means for comparing circuit conditions existing between said plurality of end points as determined by said detection means and as stored in said storage means; and signaling means connected to said comparing means for indicating the result of the operation performed by said comparing means, said testing means including sequencing circuit means for applying said signal to a single end point of one of said preselected groups and sequentially to each of a plurality of end points of others of said preselected groups prior to applying said signal to another end point of said one preselected group.

* * * * *